(12) United States Patent
Sundaram et al.

(10) Patent No.: US 7,620,151 B2
(45) Date of Patent: Nov. 17, 2009

(54) HIGH VOLTAGE TANK ASSEMBLY FOR RADIATION GENERATOR

(75) Inventors: Senthil Kumar Sundaram, Navi Mumbai (IN); Rohini Krishnamoorthy, Bangalore (IN)

(73) Assignee: General Electric Co, Schenectady, NY (US)

( * ) Notice: Subject to any disclaimer, the term of this patent is extended or adjusted under 35 U.S.C. 154(b) by 149 days.

(21) Appl. No.: 11/834,952

(22) Filed: Aug. 7, 2007

(65) Prior Publication Data

US 2009/0041192 A1 Feb. 12, 2009

(51) Int. Cl.
*H05G 1/12* (2006.01)

(52) U.S. Cl. ...................................... 378/104

(58) Field of Classification Search ......... 378/101–107, 378/119, 121
See application file for complete search history.

(56) References Cited

U.S. PATENT DOCUMENTS

| | | | |
|---|---|---|---|
| 5,079,069 A | 1/1992 | Howard et al. | |
| 5,083,307 A * | 1/1992 | Meinel et al. | 378/200 |
| 5,162,977 A | 11/1992 | Paurus et al. | |
| 5,261,153 A | 11/1993 | Lucas | |
| 5,444,757 A * | 8/1995 | Beyerlein et al. | 378/101 |
| 6,043,987 A | 3/2000 | Goodwin et al. | |
| 6,137,671 A | 10/2000 | Staffiere | |
| 6,215,649 B1 | 4/2001 | Appelt et al. | |
| 6,678,144 B2 | 1/2004 | Higashi et al. | |
| 6,795,294 B2 | 9/2004 | Kuroda et al. | |
| 6,980,416 B2 | 12/2005 | Sakaguchi et al. | |
| 7,016,490 B2 | 3/2006 | Beutler et al. | |
| 2001/0022718 A1 | 9/2001 | Appelt et al. | |
| 2005/0108874 A1 | 5/2005 | Lee et al. | |
| 2006/0109033 A1 | 5/2006 | Sundaram | |

* cited by examiner

*Primary Examiner*—Courtney Thomas (57) ABSTRACT

In one embodiment, a voltage rectifier circuit for a radiation generator is provided. The voltage rectifier circuit is configured to be used in a voltage multiplier circuit and a voltage doubler circuit. The voltage rectifier circuit comprises at least one first printed circuit board and at least one second printed circuit board coupled to each other using a plurality of connectors. Further, each printed circuit board comprises, a first terminal, a second terminal, a third terminal, a diode assembly externally connected between the first terminal and the second terminal and a capacitor assembly embedded between the second terminal and the third terminal.

19 Claims, 9 Drawing Sheets

HIGH VOLTAGE TANK ASSEMBLY FOR RADIATION GENERATOR

BACKGROUND OF THE INVENTION

The subject matter described herein generally relates to a radiation generator and more particularly to a high voltage tank assembly used in a radiation generator.

An imaging device comprising a 'C' arm incorporates a radiation generator and a radiation detector. The radiation generator generally comprises a radiation source, a high voltage tank assembly configured to energize the radiation source and a power circuit. As the high voltage tank assembly responsible for generating the high voltage required for the operation of the radiation source represents a substantial part of the overall size of the radiation generator, it is desirable to provide a compact high voltage tank assembly.

Further, the high voltage tank assembly comprises a voltage rectifier circuit and a transformer assembly coupled to the voltage rectifier circuit. The voltage rectifier circuit and the transformer assembly are among bulky modules of the radiation generator.

The transformer assembly is configured to include a high voltage transformer and/or a filament transformer. The conventional filament transformer comprises a primary winding, a first bobbin to house the primary winding, a secondary winding, a second bobbin to house the secondary winding, a core and a shield. The first bobbin, the second bobbin and the shield are placed concentrically with the primary winding close to the core. The secondary winding of the filament transformer is biased at the cathode potential of the X ray tube. Thus, the filament transformer may include one or more insulation sheets to strengthen the insulation between the secondary winding and the core thereby resulting in bulkiness of the filament transformer.

The voltage rectifier circuit comprises many electrical components such as diodes, capacitors and resistors for high voltage generation. From component manufacturing trend perspective and thereby as well from cost perspective, it is common to find use of SMD components in design. The diodes for the voltage rectifier circuit, for manufacturing and cost advantage, are increasingly desired in SMD packages. A plurality of SMD diodes with a PIV rating of about 1 kV are typically put in series to function as a high voltage diode. One limitation associated with use of the diode series is with regard to the dimension of the printed circuit board required to host the diode series.

Further, the choice of the capacitors for high voltage generation is based on the power requirement of the high voltage tank assembly. For mobile RAD application, the radiation generator is desired to be cost effective with a peak power requirement of about few kilo Watts. Capacitors with ceramic insulation are generally not suited for such an application as the peak power requirement is high and the duration is long. The ceramic capacitors carry a risk of loss of performance (high ripple) due to losses in ceramic. Alternatives such as high voltage capacitors with mica or polypropylene insulation generally result in bulky design for the radiation generator.

On the other hand, the art of using capacitors formed in the printed circuit board is a well-known technique. A dielectric material in between two conductive planes forms a capacitor, and in the printed circuit board existence of capacitance between two tracks or planes is a common knowledge. Prior art methods generally use the built-in capacitors as decoupling capacitors to swamp out parasitic effect, typically in an electronic industry in need of high packing density of electronic components. Thus, most of the activity with regard to the built in capacitance in the printed circuit board is concentrated around treatment of such capacitance for the purpose of decoupling, thereby inefficiently using the in built capacitance in the printed circuit board.

Hence, there exists a need to provide a compact and efficient design for assembling various components of the high voltage tank assembly used in the radiation generator.

BRIEF DESCRIPTION OF THE INVENTION

The above-mentioned shortcomings, disadvantages and problems are addressed herein which will be understood by reading and understanding the following specification.

In one embodiment, a voltage rectifier circuit for a radiation generator is provided. The voltage rectifier circuit is configured to be used in a voltage multiplier circuit and a voltage doubler circuit. The voltage rectifier circuit comprises at least one first printed circuit board and at least one second printed circuit board coupled to each other using a plurality of connectors. Further, each printed circuit board comprises, a first terminal, a second terminal, a third terminal, a diode assembly externally connected between the first terminal and the second terminal and a capacitor assembly embedded between the second terminal and the third terminal.

In another embodiment, a high voltage tank assembly for a radiation generator is provided. The high voltage tank assembly comprises a voltage rectifier circuit and a transformer assembly coupled to the voltage rectifier circuit. The voltage rectifier circuit is configured to include at least one first printed circuit board and at least one second printed circuit board coupled to each other using a plurality of connectors. Further, each printed circuit board comprises, a first terminal, a second terminal, a third terminal, a diode assembly externally connected between the first terminal and the second terminal and a capacitor assembly embedded between the second terminal and the third terminal.

In yet another embodiment, a high voltage tank assembly for a radiation generator is provided. The high voltage tank assembly comprises a voltage rectifier circuit configured to include at least one of a cathode multiplier and an anode multiplier and a transformer assembly coupled to the voltage rectifier circuit, the transformer assembly configured to include a high voltage transformer and a filament transformer. The filament transformer comprises a core, a primary winding, a secondary winding, a bobbin configured to house the primary winding and at least one printed circuit board configured to house the secondary winding.

Systems and methods of varying scope are described herein. In addition to the aspects and advantages described in this summary, further aspects and advantages will become apparent by reference to the drawings and with reference to the detailed description that follows.

DETAILED DESCRIPTION OF THE INVENTION

In the following detailed description, reference is made to the accompanying drawings that form a part hereof, and in which is shown by way of illustration specific embodiments, which may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken in a limiting sense.

The invention may take form in various components and arrangements of components. The drawings are only for purposes of illustrating various embodiments and are not to be construed as limiting the invention.

An imaging apparatus such as a computed tomography apparatus and an X ray apparatus, configured to image objects, comprises a radiation generator, a radiation detector and a data acquisition system. The radiation generator generates electromagnetic radiation for projection towards the object to be scanned. The electromagnetic radiation includes X rays, gamma rays and other HF electromagnetic energy. The X rays incident on the object being scanned are attenuated by the object. The radiation detector comprises multiple detector elements for converting the attenuated X rays into electrical signals. The electrical signals so formed are named as projection data. The data acquisition system (DAS) samples the projection data from the detector elements and converts the projection data into digital signals for computer processing.

Figure 1:
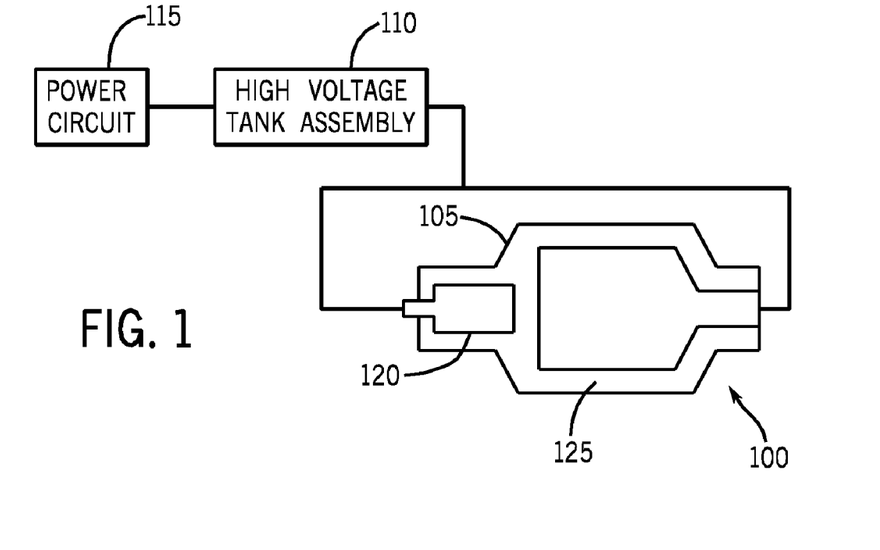
FIG. 1 shows a schematic diagram of an exemplary embodiment of the radiation generator.

FIG. 1 shows an exemplary embodiment of a radiation generator 100. In the illustrated embodiment of FIG. 1, the radiation generator 100 is an X-ray generator and the radiation source 105 is an X-ray tube electrically coupled in a conventional manner to a high voltage tank assembly 110 so as to create an emission of X-rays. Skilled artisans shall however appreciate that the radiation source 105 can be housed inside the high voltage tank assembly 110 as well. The radiation generator 100 further comprises a power circuit 115 coupled to the high voltage tank assembly 110, configured to supply power to drive the high voltage tank assembly 110.

The illustrated X-ray tube generally includes a cathode 120 located opposite an anode 125 in general alignment along a longitudinal axis of the X-ray tube. The cathode 120 includes an electron-emitting filament that is capable in a conventional manner of emitting electrons. The high voltage potential supplied by the high voltage tank assembly 110 causes acceleration of the electrons from the cathode 120 towards the anode 125. The accelerated electrons collide with the anode 125, producing electromagnetic radiation, including X-ray radiation.

The elements, which are the same as or correspond to elements of FIG. 1, are denoted by the same reference numerals, so that in this sense the description need not be repeated and only the differences will be dealt with.

Figure 2:
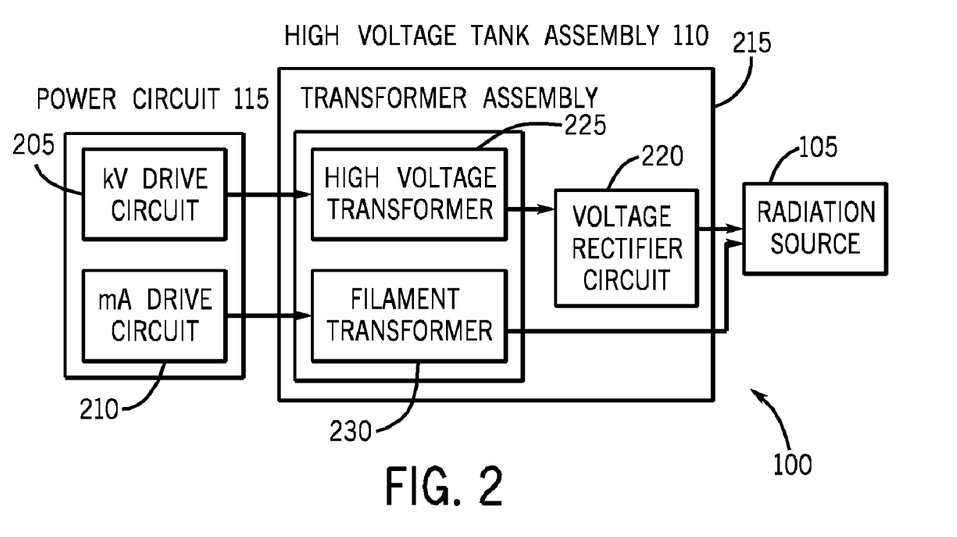
FIG. 2 shows a block diagram of the radiation generator shown at FIG. 1.

FIG. 2 shows a block diagram of the radiation generator 100 shown at FIG. 1. An external input power source (not shown) is coupled to the radiation generator 100. The power circuit 115 houses circuitry necessary to convert the power from the external input power source (not shown) to voltages needed to drive and regulate x-ray generation. The power circuit 115 comprises two principal power sections; a kV drive circuit 205 and a mA drive circuit 210. The kV drive circuit 205 provides power to enable the high voltage tank assembly 110 to develop the high voltage potentials necessary to generate X-rays. The mA drive circuit 210 provides power to the X-ray tube filament for heating the filament so as to emit electrons. The mA drive circuit 210 allows control of the number of electrons boiled off by the filament, and thus provides control of the tube current flow. The power circuit 115 also houses a plurality of low voltage power supplies, which are used to furnish biasing voltages to an internal circuitry within the power circuit 115.

The high voltage tank assembly 110 is designed to receive an AC waveform from the power circuit 115 and condition the AC waveform to provide a high voltage DC potential to the X-ray tube where the anode 125 and the cathode 120 usually carry equal voltages of different polarity. The high voltage tank assembly 110 comprises a transformer assembly 215 and a voltage rectifier circuit 220. The transformer assembly 215 coupled to the voltage rectifier circuit 220 comprises a high voltage transformer 225 and/or a filament transformer 230. The transformer assembly 215 and the voltage rectifier circuit 220 of the high voltage tank assembly 110 condition the AC voltage signal transferred by the power circuit 115.

The AC voltage from the kV drive circuit 205 is applied to the primary winding of the high voltage transformer 225 within the high voltage tank assembly 110. The high voltage transformer 225 increases the amplitude of the AC square wave voltage at the secondary winding. The high voltage AC signal is applied in turn to the voltage rectifier circuit 220. The voltage rectifier circuit 220 comprises a plurality of serially connected voltage multiplying-rectifying stages having a low voltage potential end and a high voltage potential end. The low voltage potential end is connected to the secondary winding of the high voltage transformer 225 and the high voltage potential end is connected to the X-ray tube electrodes.

In parallel with the multiple-stage voltage rectifier circuit 220 is the filament transformer 230 producing AC filament heating output currents for the X-ray tube filaments. The AC voltage generated by the mA drive circuit 210 is applied as input to the filament transformer 230 that provides voltages appropriate for driving the X-ray tube filaments.

Figure 3:
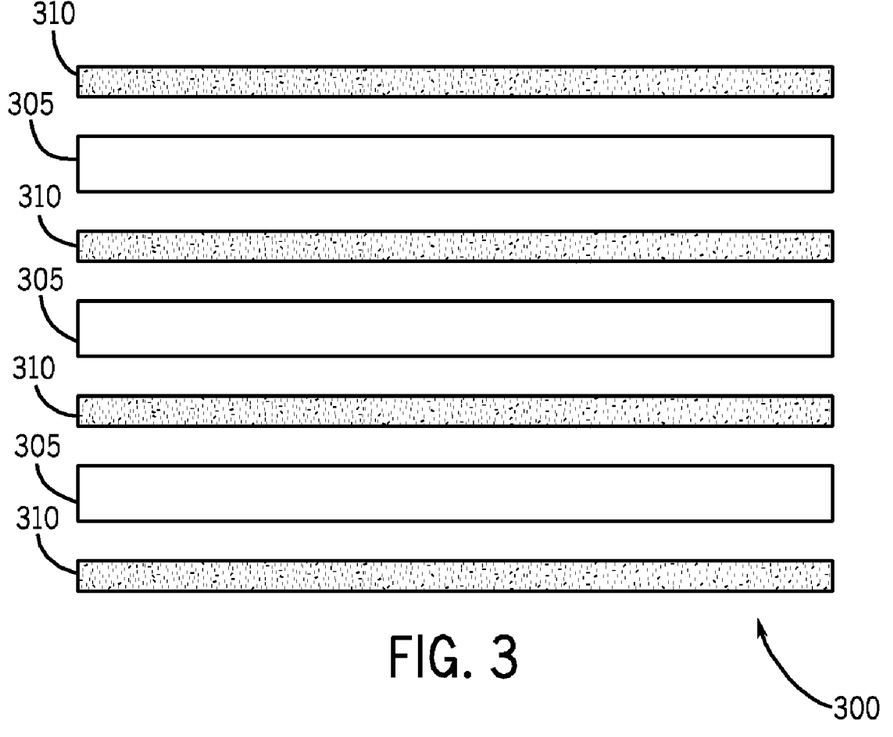
FIG. 3 shows a schematic diagram of a cross sectional view of the printed circuit board in one embodiment.

In one embodiment, the voltage rectifier circuit 220 is configured to include at least one printed circuit board. A cross sectional view of the printed circuit board 300 is shown at FIG. 3. The printed circuit board 300 may comprise a plurality of dielectric mediums 305 and each dielectric medium 305 may be separated by at least one electrically conductive plane 310. Each dielectric medium 305 may comprise one or more layers of material having a high dielectric constant. Further, each electrically conductive plane 310 of the printed circuit board 300 can comprise multiple layers of an electrically conductive material. Although FIG. 3 shows the printed circuit board 300 having four electrically conductive planes 310, and three dielectric mediums 305, it is understood that the number of the electrically conductive planes 310 and the dielectric mediums 305 can vary.

The high dielectric constant material is typically a resin/epoxy material with added high dielectric constant filler. In an exemplary embodiment, each electrically conductive plane 310 may comprise one of a metal, a compound of a metal (such as a metal oxide, metal phosphate and metal sulphate), and an alloy of a metal or combination thereof. The metal can be selected from a group consisting of tungsten, calcium, tantalum, tin, molybdenum, brass, copper, strontium, chromium, aluminum and bismuth. However, it is understood that the composition of the dielectric medium 305 and the electrically conductive plane 310 of the printed circuit board 300 are not limited to the examples given above.

Although a single printed circuit board 300 is referenced and illustrated, it is understood that the voltage rectifier circuit 220 may be comprised of multiple printed circuit boards, each printed circuit board comprising multiple dielectric mediums 305 and multiple electrically conductive planes 310, similar to the construction of the printed circuit board 300 described above.

The presence of the dielectric medium 305 in between the electrically conductive planes 310 results in the formation of capacitance. The formation of a capacitor in the printed circuit board 300 is utilized to form filter capacitances for the voltage rectifier circuit 220. Further, the printed circuit board 300 can as well be used to house other electrical components that are part of generation and measurement of the high voltage DC.

Thus, one embodiment describes a method of creating capacitance by making use of the conductive planes 310 in the printed circuit board 300 as electrodes, and dielectric medium 305 in the printed circuit board 300 as the insulation and effectively packing various components of the high voltage tank assembly 110.

Figure 4:
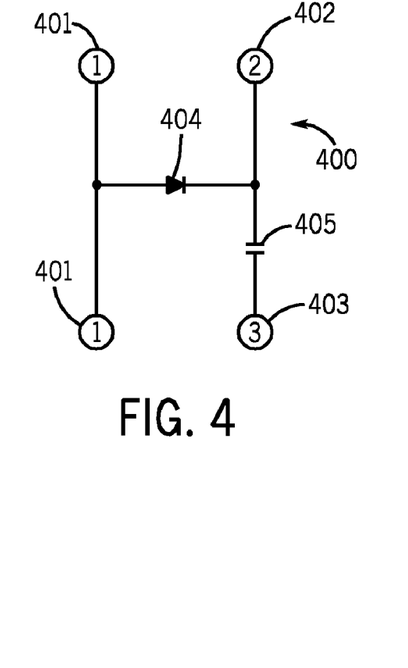
FIG. 4 shows a schematic diagram of a basic block of a voltage rectifier circuit.

Each printed circuit board 300 comprises a basic block 400 schematically represented by FIG. 4. The basic block 400 comprises at least one diode assembly 404 and at least one capacitor assembly 405 connected and having input and output terminals 401, 402 and 403 as shown in FIG. 4.

Figure 5:
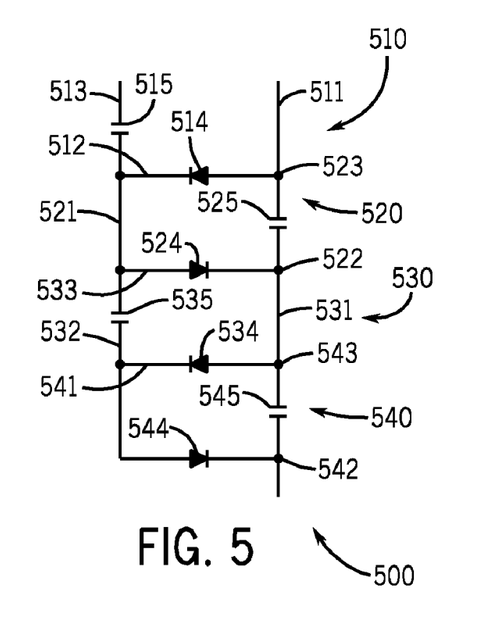
FIG. 5 shows a schematic diagram of an exemplary embodiment of a voltage rectifier circuit.

In one embodiment as shown in FIG. 5, the invention provides flexibility to use the voltage rectifier circuit 220 having multiple printed circuit boards 510, 520, 530 and 540, each comprising the basic block 400, as a part of a voltage multiplier circuit and/or as a part of a voltage doubler circuit. Further, a first printed circuit board 510 can be symmetrical to a second printed circuit board 520 and a third printed circuit board 530 can be symmetrical to a fourth printed circuit board 540. The symmetrical design helps in stacking multiple printed circuit boards 510, 520, 530 and 540.

Further, the printed circuit boards 510, 520, 530 and 540 can be connected in different configurations to form different stages of the voltage multiplier circuit and/or the voltage double circuit. FIG. 5 depicts a two-stage voltage multiplier circuit 500. To cater to the adoption, each of the printed circuit boards 510, 520, 530 and 540 comprises at least one diode assembly 514, 524, 534 and 544 and at least one capacitor assembly 515, 525, 535 and 545, a first terminal 511, 521, 531 and 541, a second terminal 512, 522, 532 and 542 and a third terminal 513, 523, 533 and 543. Each diode assembly 514, 524, 534 and 544 is connected between the first terminal 511, 521, 531 and 541 and the second terminal 512, 522, 532 and 542 and each capacitor assembly 515, 525, 535 and 545 is connected between the second terminal 512, 522, 532 and 542 and the third terminal 513, 523, 533 and 543.

Accordingly, the first terminal 511 of the first printed circuit board 510 is connected to the third terminal 523 of the second printed circuit board 520 and the second terminal 512 of the first printed circuit board 510 is connected to the first terminal 521 of the second printed circuit board 520. Similarly, the first terminal 531 of the third printed circuit board 530 is connected to the third terminal 543 of the fourth printed circuit board 540 and the second terminal 532 of the third printed circuit board 530 is connected to the first terminal 541 of the fourth printed circuit board 540. Furthermore, the first terminal 511 of the first printed circuit board 510 is connected to a point maintained at a ground potential and the second terminal 542 of the fourth printed circuit board 540 is connected to the radiation source 105.

Skilled artisans shall however appreciate that the connections between various terminals in each stage of the voltage rectifier circuit 220 can vary to enhance the rating or reliability of the corresponding stage, thus resulting in an enhanced performance of each stage.

Each diode assembly 514, 524, 534 and 544 comprises one or more serially connected diodes mounted on the respective printed circuit boards 510, 520, 530 and 540. In one embodiment, in order to utilize a single layer and to overcome the constraint in dimension for packaging the components of the voltage rectifier circuit 220, the diodes can be selected to be surface mount devices (SMD). The main advantage of using SMDs is the availability of adequate space in each printed circuit board 510, 520, 530 and 540 to be formed as a capacitor.

Figure 6:
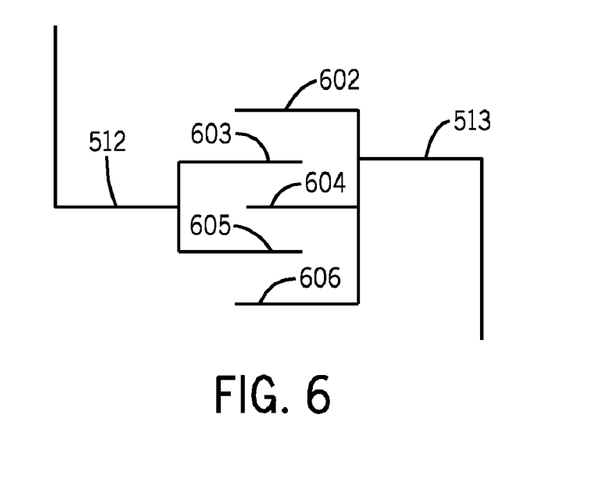
FIG. 6 shows a schematic diagram of an exemplary embodiment of a capacitor assembly.

Each capacitor assembly 515, 525, 535 and 545 may comprise at least a portion of the corresponding printed circuit board 510, 520, 530 and 540 formed by addition of capacitance in multiple layers of the printed circuit board 510, 520, 530 and 540. FIG. 6 depicts the capacitor assembly 515 located between the second terminal 512 and the third terminal 513 of the printed circuit board 510. The capacitor assembly 515 is formed by connecting multiple layers 602, 603, 604, 605 and 606 of the printed circuit board 510 in series or parallel combination. The layers 602, 603, 604, 605 and 606 of the printed circuit board 510 may be similar in construction to the layers 305 and 310 of the printed circuit board 300 described above.

In an alternative embodiment, the capacitor assembly 515 can be a combination of commercially available capacitors and a portion of the printed circuit board 510. The printed circuit board 510 when used in combination with the commercially available capacitors provides an optimized solution to cost and space.

In one embodiment, the voltage multiplier circuit 500 schematically represented at FIG. 5 can include an anode multiplier and/or a cathode multiplier. Further, to be more specific, FIG. 5 shows the anode multiplier. The basic block 400 can be used for the cathode multiplier when each diode assembly 404 (shown at FIG. 4) is placed in a direction opposite to that shown in FIG. 5. Typically, a configuration for a three-stage anode multiplier may comprise six printed circuit boards. This is further explained in conjunction with FIG. 7. Skilled artisans shall however appreciate that the stacking can further be extended to form higher stages of the voltage multiplier circuit 500.

On the other hand, the stacking of the printed circuit boards 510, 520, 530 and 540 can be reduced or increased based on the number of stages desired for the voltage multiplier circuit 500. For example, a half stage voltage multiplier circuit 500 can comprise a single printed circuit board 510 having the basic block 400.

Figure 7:
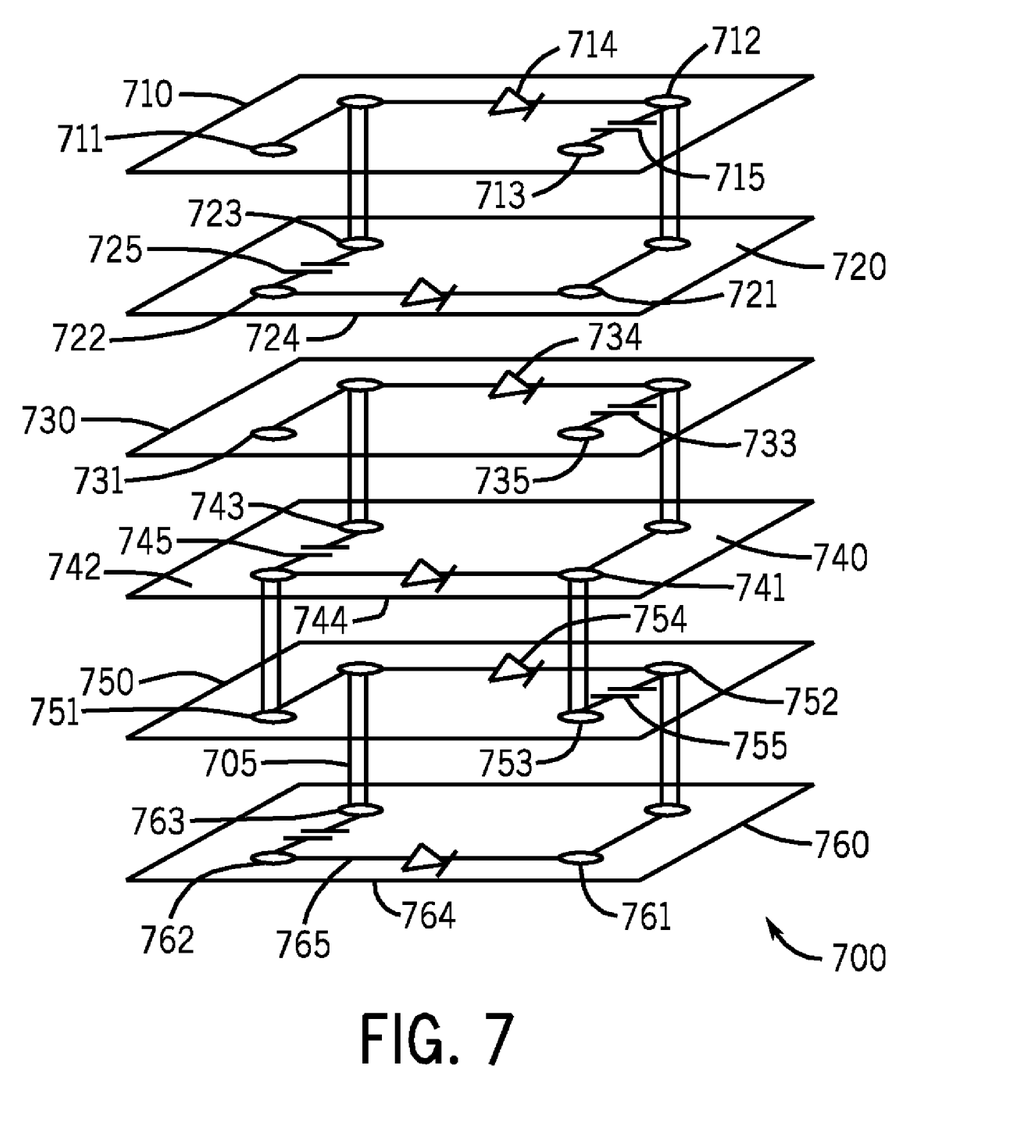
FIG. 7 shows an exploded cross sectional schematic diagram of an exemplary embodiment of an anode multiplier.

FIG. 7 shows a cross sectional view of the anode multiplier 700 shown at FIG. 5. Each of the printed circuit board 710, 720, 730, 740, 750 and 760 is coupled electrically and mechanically to a succeeding printed circuit board 710, 720, 730, 740, 750 and 760 using a plurality of connectors 705. For example, the first printed circuit board 710 and the second printed circuit board 720 are coupled to each other using a plurality of connectors 705. As described above, each printed circuit board 710, 720, 730, 740, 750 and 760 comprises a diode assembly 714, 724, 734, 744, 754 and 764 connected between the first terminal 711, 721, 731, 741, 751 and 761 and the second terminal 712, 722, 732, 742, 752 and 762 and a capacitor assembly 715, 725, 735, 745, 755 and 765 connected between the second terminal 712, 722, 732, 742, 752 and 762 and the third terminal 713, 723, 733, 743, 753 and 763.

The conductive planes 310 in each printed circuit board 710, 720, 730, 740, 750 and 760 are spread over the large surface area of the corresponding printed circuit board 710, 720, 730, 740, 750 and 760. Further each printed circuit board 710, 720, 730, 740, 750 and 760 comprises one or more PTHs. The PTHs form connecting terminals for the connectors 705 providing provision for heat dissipation. The connectors 705 in addition to providing the mechanical support facilitate heat dissipation along the large surface area of the conducting planes 310 in each printed circuit board 710, 720, 730, 740, 750 and 760.

Figure 8:
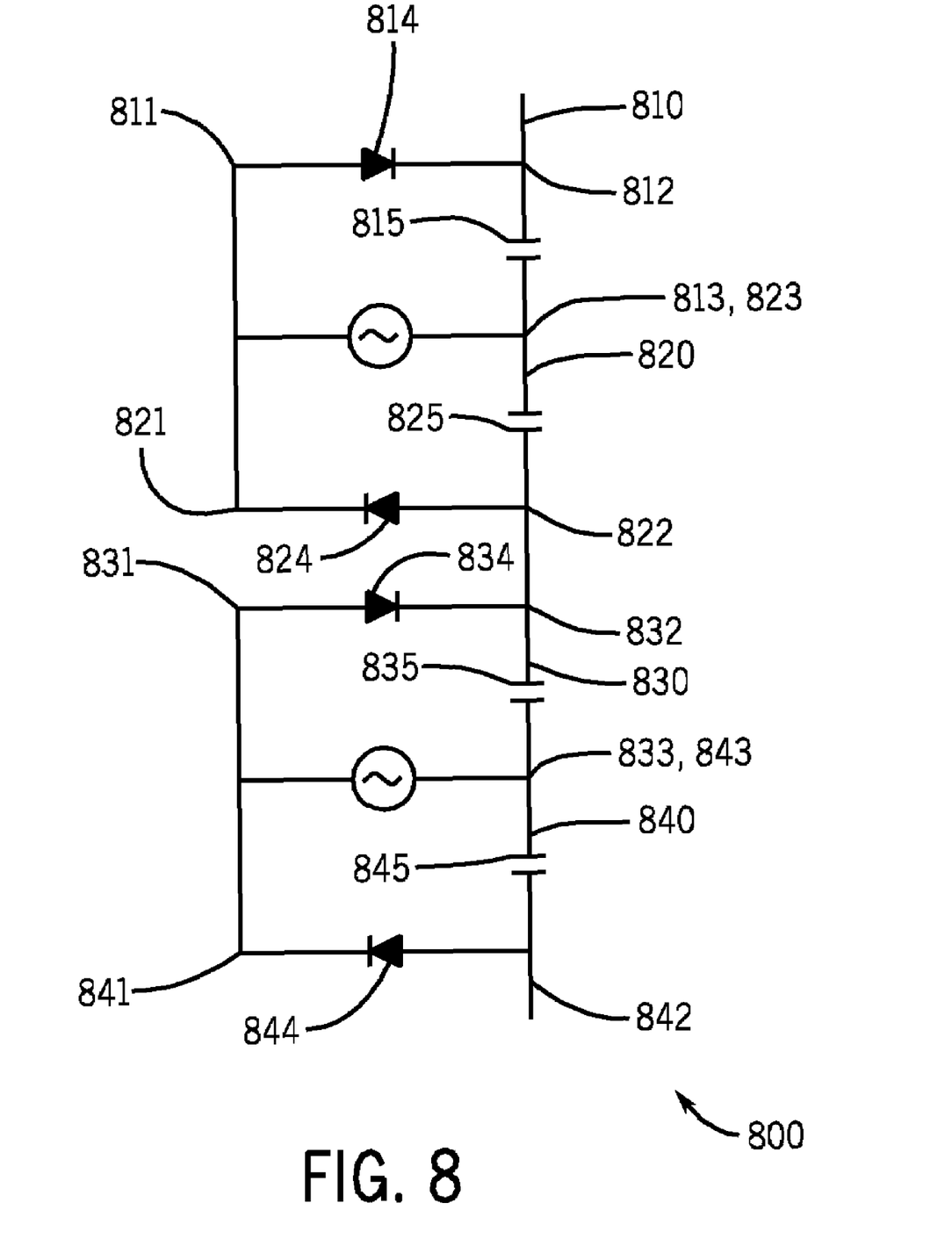
FIG. 8 shows a schematic diagram, representing configuration for a two-stage voltage doubler circuit.

Alternatively with a change in terminal connections between the first printed circuit board 710 and the second printed circuit board 720, the basic block 400 can be suited to form the voltage doubler circuit. Accordingly, FIG. 8 shows the configuration for a two-stage voltage doubler circuit 800. As described in FIG. 5 and FIG. 7, each printed circuit board 810, 820, 830 and 840 comprises a diode assembly 814, 824, 834 and 844 connected between the first terminal 811, 821, 831 and 841 and the second terminal 812, 822, 832 and 842 and a capacitor assembly 815, 825, 835 and 845 connected between the second terminal 812, 822, 832 and 842 and the third terminal 813, 823, 833 and 843.

Further, the first terminal 811 and the third terminal 813 of the first printed circuit board 810 are connected respectively to the first terminal 821 and the third terminal 823 of the second printed circuit board 820. Similarly, the first terminal 831 and the third terminal 833 of the third printed circuit board 830 are connected respectively to the first terminal 841 and the third terminal 843 of the fourth printed circuit board 840. Further, the second terminal 812 of the first printed circuit board 810 is connected to a point maintained at a ground potential and the second terminal 842 of the fourth printed circuit board 840 is connected to the radiation source 105. Skilled artisans shall however appreciate that the connections between various terminals can be varied to complement each other thereby enabling the voltage doubler circuit 800 to carry out a substantially similar function of multiplying the input voltage.

Thus, the basic block 400 is versatile and can easily be configured to form a plurality of stages in the voltage multiplier circuit 500 and the voltage doubler circuit 800. The method of increasing the number of stages comprises adding two additional printed circuit boards and connecting the printed circuit boards using the connectors 705. Thus, the number of stages in the voltage multiplier circuit 500 and the voltage doubler circuit 800 can easily be varied.

Figure 9:
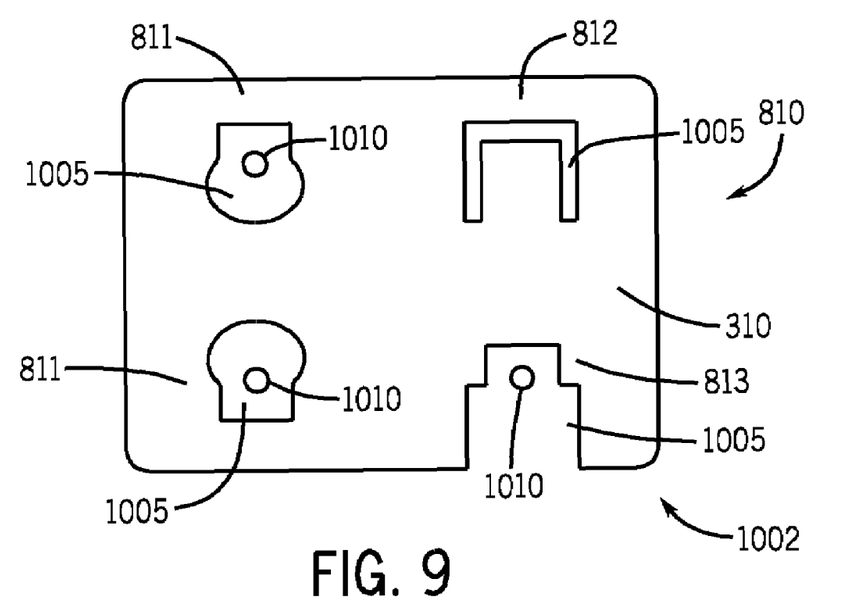
FIG. 9 shows a top view schematic diagram of a first conductive plane in a printed circuit board.
Figure 10:
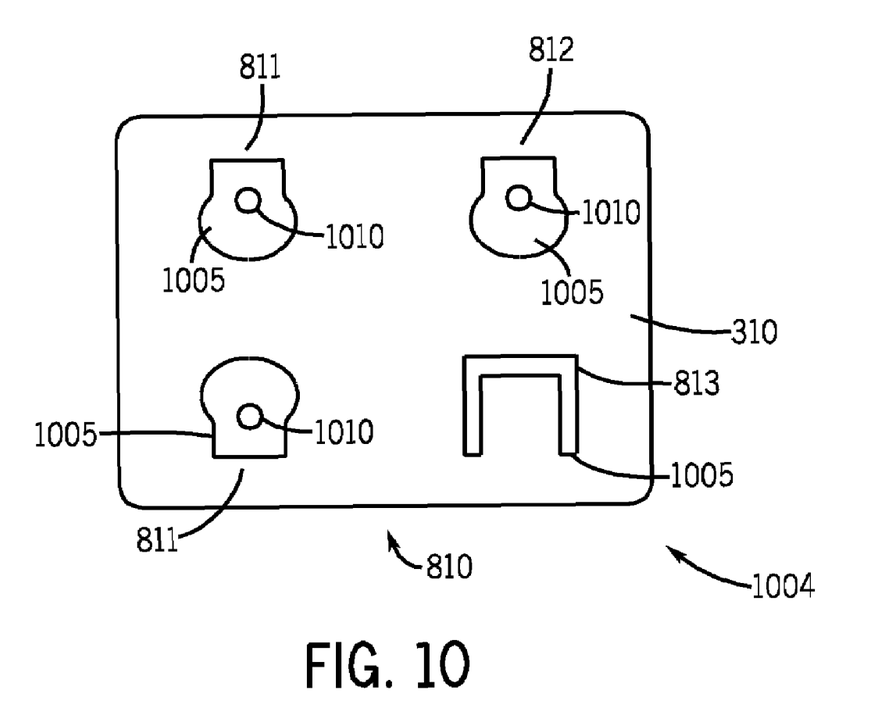
FIG. 10 shows a top view schematic diagram of a second conductive plane in a printed circuit board.

In a continued effort to provide a compact high voltage tank assembly 110, the design of the printed circuit board 810 is further made compact by providing grooves and/or slots in the printed circuit board 810, to obtain a predetermined creepage. FIG. 9 and FIG. 10 show a top view of a first conductive plane 1002 and a second conductive plane 1004 respectively, of the printed circuit board 810. As shown in the FIGs, each printed circuit board 810 comprises multiple grooves 1005 and reliefs, including PTHs 1010, in the conductive planes 1002 and 1004 for attaining desired creepage in a limited space.

Referring back to FIG. 6, in an exemplary embodiment, the resultant capacitance of about 2800 pF can be obtained with the printed circuit board 510 having a dimension of about 120 mm×90 mm. The effective capacitance of that value may be needed for each stage of the voltage multiplier circuit 500. However, the value of the capacitance in the printed circuit board 510 can be varied by connecting various layers 602 603, 604, 605 and 606 of the printed circuit board 510 in series and/or parallel combination. Thereby the voltage withstand ability of the printed circuit board 510 can be varied.

Generally, the high voltage generated in the radiation source 105 is measured using one or more additional high voltage components. These additional high voltage components may also perform the function of discharging multiple capacitors used in the voltage multiplier circuit 500. The high voltage components include at least one high voltage resistor having a resistance value in the range of hundreds of mega ohms and at least one high voltage capacitor lumped or distributed along with the high voltage resistor. However, the value of the high voltage resistor and the high voltage capacitor may vary for various applications. Further, the presence of the high voltage capacitor may include multiple shields at selected electrical potentials provided around the high voltage resistor. The shields with their inherent capacitance regulate stray capacitance around the high voltage resistor.

Figure 11:
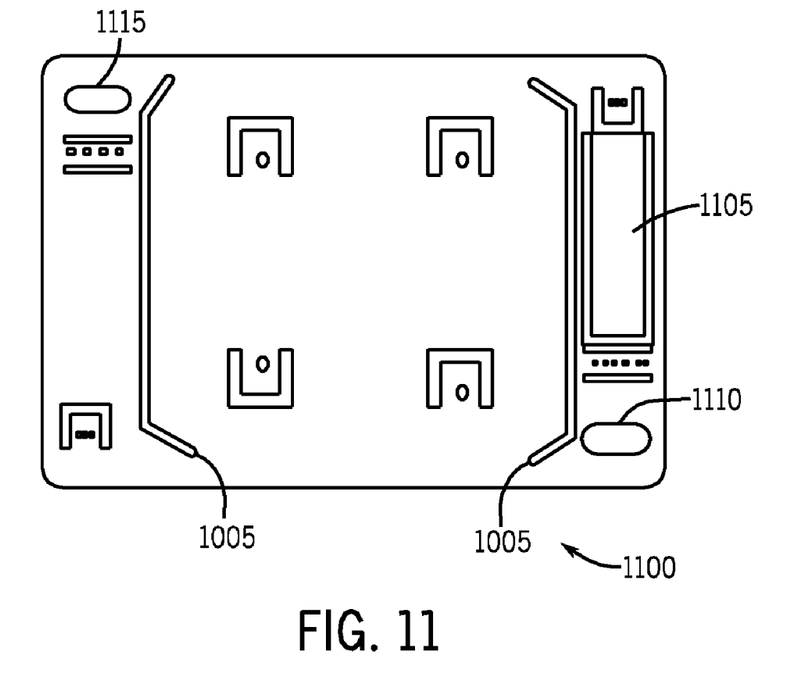
FIG. 11 shows a schematic representation of mounting a high voltage resistor in one embodiment.

The high voltage resistor can be mounted using multiple options. In one embodiment, the high voltage resistor comprises a set of voltage resistors. Each voltage resistor is mounted on a single printed circuit board and the set of voltage resistors are connected in series through a printed circuit board stack. FIG. 11 depicts one such arrangement. On each printed circuit board 1100, along with the mounting of the voltage resistors, at least a portion of the printed circuit board 1100 can be configured to swamp out the parasitic effect around the high voltage resistor 1105. As described in FIG. 6, the capacitance offered by the printed circuit board 1100 is configurable, as the printed circuit board 1100 comprises multiple layers of the conductive planes 310 and the dielectric medium 305. The configurable capacitance can be set, choosing from multiple layers representing various values of the capacitance, suitable for compensation and/or overdamping, through use of electrical connectors such as jumpers on the printed circuit board 1100.

The use of configurable built-in capacitance across the high voltage resistor 1105 facilitates easy mounting of the high voltage resistor 1105. Further, the variable option on capacitance value for high voltage resistor compensation provides flexibility in mounting the high voltage resistor 1105.

Figure 12:
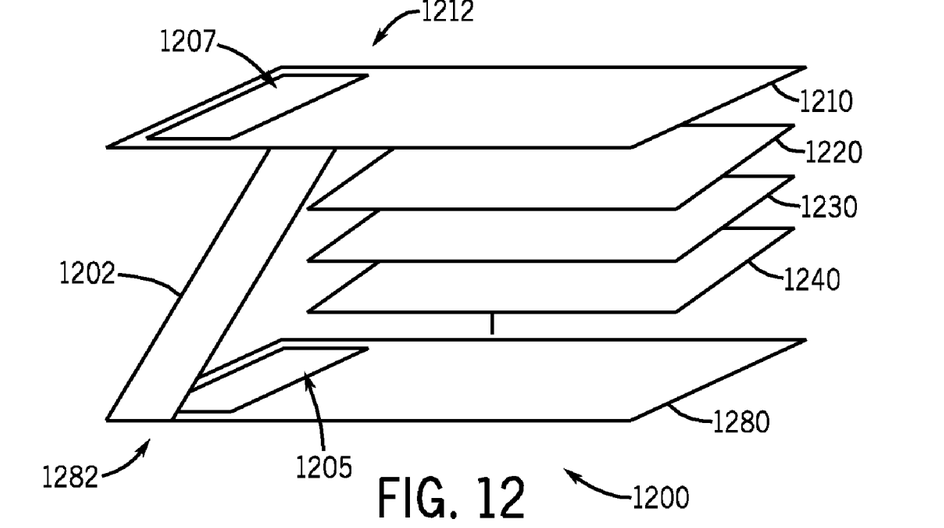
FIG. 12 shows a schematic diagram of a perspective view of another embodiment of mounting a high voltage resistor.

Further, the printed circuit board 1100 can comprise provisions for vertical mounting 1110 of the high voltage resistor 1105. FIG. 12 illustrates an embodiment in which a high voltage resistor 1202 is mounted in the vertical configuration 1200. In this configuration 1200, the high voltage resistor 1202 can be configured to be mounted between a high voltage shield 1205 and a low voltage shield 1207. For this, a dedicated plane is constructed in an extended part 1212 and 1282 of the selected printed circuit boards 1210 and 1280 among the plurality of printed circuit boards 1210, 1220, 1230, 1240 and 1280.

Figure 13:
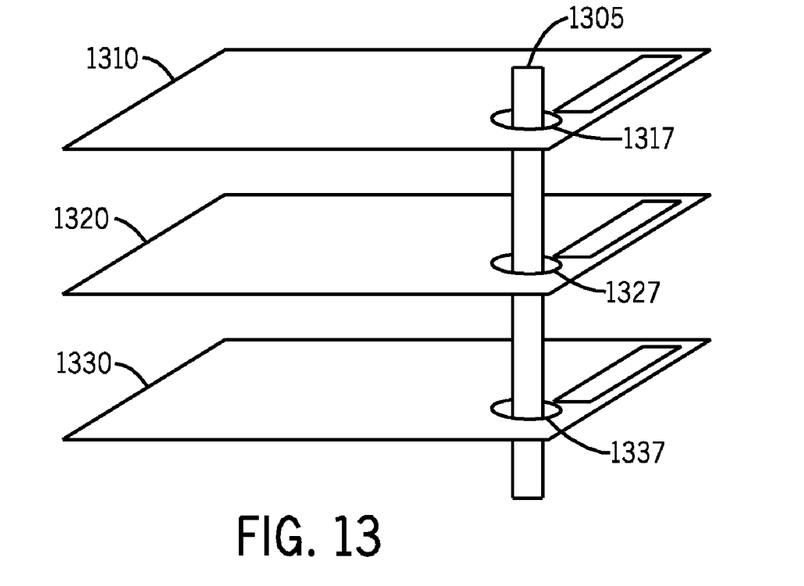
FIG. 13 shows a schematic representation of mounting the high voltage resistor in yet another embodiment.

In yet another alternate embodiment shown at FIG. 13, a high voltage resistor 1305 is mounted in an anti symmetrical configuration 1115. In the anti symmetrical configuration 1115, space for vertical mounting is provided on one or more printed circuit boards 1310, 1320 and 1330 that are mounted anti symmetrically. The high voltage resistor 1305 can be a single resistor that can be placed though multiple printed circuit boards 1310, 1320 and 1330 forming the cathode multiplier and/or the anode multiplier 700. Each printed circuit board 1310, 1320 and 1330 can be configured to have a PTH 1317, 1327 and 1337 that is maintained at a voltage potential corresponding to the respective printed circuit board 1310, 1320 and 1330. The high voltage resistor 1305 can be configured to pass through multiple PTHs 1317, 1327 and 1337 running across multiple printed circuit boards 1310, 1320 and 1330. Further, the high voltage resistor 1305 can be connected in parallel with a configurable capacitor assembly (not shown) at each printed circuit board 1310, 1320 and 1330. Each configurable capacitor assembly (not shown) comprises at least a portion of the corresponding printed circuit board 1310, 1320 and 1330.

Further, the printed circuit boards 1310, 1320 and 1330 may comprise a NPTH (not shown) as an alternative to a PTH 1317, 1327 and 1337 to avoid having large differences in the voltage potential. Thus, the voltage potential across the high voltage resistor 1305 can be suitably graded.

Figure 14:
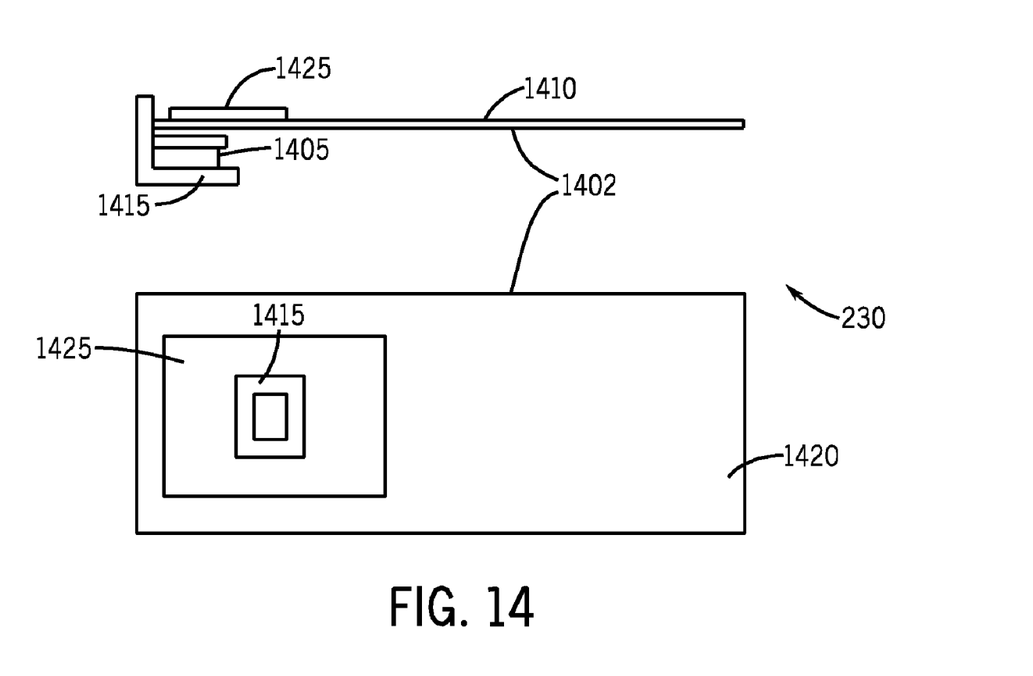
FIG. 14 shows a schematic diagram of a filament transformer described in one embodiment.

Referring back to the radiation generator 100, FIG. 14 shows a schematic diagram of the filament transformer 230 described in one embodiment. The filament transformer 230 comprises a hybrid configuration. In the hybrid configuration, the filament transformer 230 comprises a core (not shown), a primary winding 1405 housed in a bobbin 1415 and a secondary winding 1410 housed in a printed circuit board 1420. The filament transformer 230 may further include one or more insulation sheets 1425 to strengthen the insulation between the secondary winding 1410 and the core (not shown). In the filament transformer 230, the number of primary windings 1405 is generally double the number of the secondary windings 1410. Therefore, the bobbin 1415 is employed for housing the primary winding 1405 as a large number of turns can be accommodated in the bobbin 1415 as opposed to employing the printed circuit board 1420 where large number of turns is difficult to achieve in planar configuration. Moreover, the bobbin 1415, in addition to providing mechanical support to the filament transformer 230, provides additional insulation for the primary winding 1405 and the core (not shown) with respect to the high voltage potential at the secondary winding 1410.

Further, to be more specific, the secondary windings 1410 are embedded in the printed circuit board 1420 forming a part of the cathode multiplier 1402. The filament transformer 230 can be mounted directly on the cathode multiplier 1402 for ease of high voltage wiring. The presence of the high voltage part of the filament transformer 230 in the cathode multiplier 1402 obviates the complication of routing separate high voltage cables to the filament transformer 230. Thus, the hybrid configuration for the filament transformer 230 mounted on the cathode multiplier 1402 results in a simple and compact design.

Figure 15:
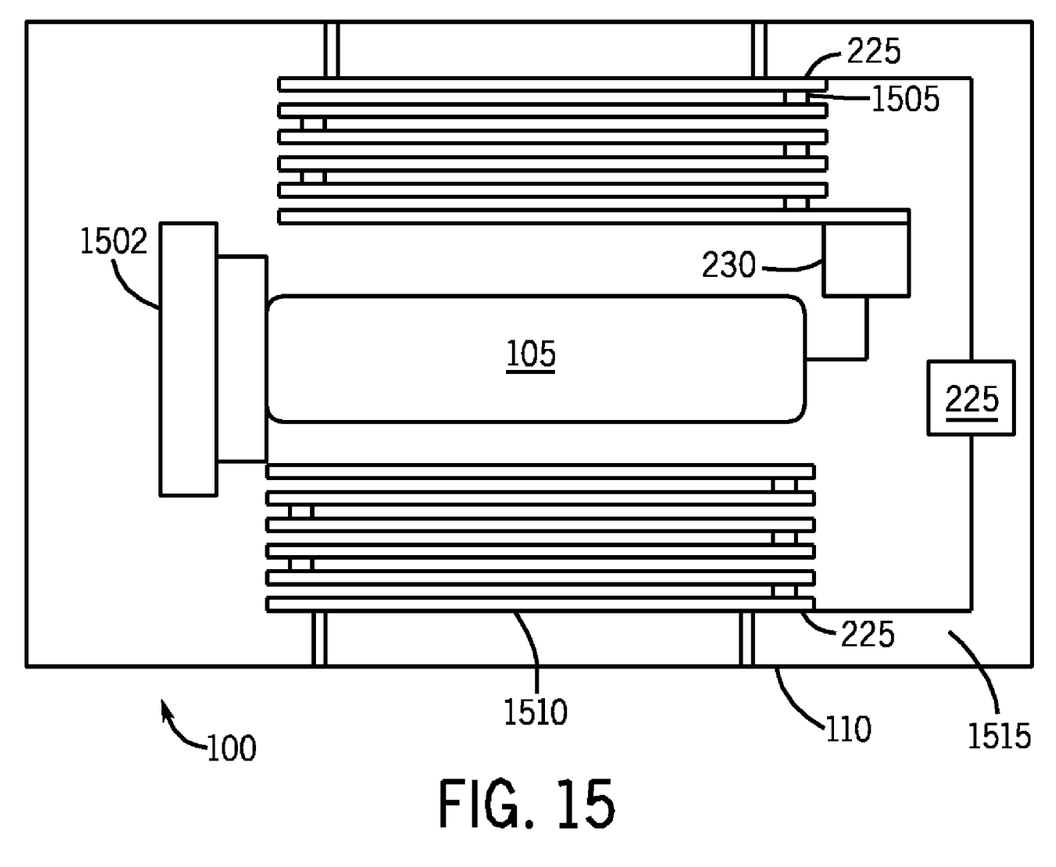
FIG. 15 shows a schematic diagram of a radiation generator showing the details of a transformer assembly mounting.

The schematic diagram of the radiation generator 100 including the details of mounting the filament transformer 230 is shown at FIG. 15. A tube mounting 1502 is employed for mounting the X ray tube 105. Each of the cathode multiplier 1505 and the anode multiplier 1510 comprise a stack of printed circuit boards immersed in the insulating medium 1515 present in the high voltage tank assembly 110. The array of multiple printed circuit boards stacked together to form the cathode multiplier 1505 and the anode multiplier 1510 are rigid, thereby reducing the need for additional packaging. The cathode multiplier 1505 comprising a block of stacked printed circuit boards can directly be mounted on the high voltage tank assembly 110. The insulating medium 1515 present in the high voltage tank assembly 110 takes care of the desired clearance by providing sufficient insulation between the electrical components mounted on each printed circuit board as a part of the voltage rectifier circuit 220. For further reinforcements to enhance insulation, insulation sheets 1425 comprising polypropylene or polyethylene insulation can be added between the printed circuit boards and/or adjacent to the printed circuit boards. Such an arrangement reduces the need for molding the insulation sheets 1425.

In one embodiment, the insulating medium 1515 such as transformer oil or epoxy potting surrounding at least a portion of each printed circuit board can be utilized to form capacitance between two adjacent printed circuit boards. Thus, the voltage rectifier circuit 220 further comprises a multiplier capacitance. The multiplier capacitance comprises two adjacent printed circuit boards as electrodes and the insulting medium 1515 between the two adjacent printed circuit boards as the dielectric medium 305. The multiplier capacitance so formed provides a high capacitance value and facilitates effective packing.

In one embodiment, each dielectric medium 305 is constructed from a composition selected from a group consisting of an epoxy, a urethane and a silicon-potting compound. Higher the dielectric constant material used in the dielectric medium 305, higher is the capacitance formed by the printed circuit board 300. In this embodiment, however, the dielectric medium 305 comprises FR-4 laminates with dielectric constant of about five. The thermal properties of the FR-4 are better compared to polypropylene or polyethylene with much reduced dielectric loss compared to a high dielectric constant material such as a ceramic.

In an additional embodiment, the printed circuit board 300 can comprise a ceramic base having a metallic coating for the conductive planes 310 in the printed circuit board 300. This may facilitate enhancing the value of capacitance. Following which, there may not be a need for providing multiple conductive planes 310 in the printed circuit board 300.

In the embodiment shown at FIG. 15, each printed circuit board in the voltage rectifier circuit 220 can be configured to have an insulation interface advantage for the printed circuit board and the surrounding insulating medium 1515. Prepeg materials having a substantially higher permittivity (higher dielectric constant) thereby capable of forming higher capacitance can be used for inner layers of the printed circuit board. The materials such as prepegs having a substantially lower permittivity (lower dielectric constant) thereby capable of forming lower capacitance can be used for outer layers of the printed circuit board, which interfaces with the insulating medium 1515 of the high voltage tank assembly 110. Such a configuration may help in providing a higher capacitance while avoiding interface and charging issues.

The design of the high voltage tank assembly 110 provided in various embodiments is a compact and cost effective solution. The number of electrical components used in the voltage rectifier circuit 220 and the space needed for placing the electrical components on the printed circuit board 300 is minimized and made manufacturer friendly. This is made possible by utilizing the printed circuit board 300 for providing electrical connections as well as for providing filter capacitance thereby facilitating a high-density packing of the electrical components on the printed circuit board 300.

In various embodiments of the invention, a high voltage tank assembly for a radiation generator and a radiation generator using a high voltage tank assembly are described. However, the embodiments are not limited and may be implemented in connection with different applications. The application of the invention can be extended to other areas, for example medical imaging systems, industrial inspection systems, security scanners, particle accelerators, etc. The invention provides a broad concept of designing a voltage rectifier circuit, which can be adapted in a similar power supply system. The design can be carried further and implemented in various forms and specifications.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A voltage rectifier circuit for a radiation generator, the voltage rectifier circuit comprising:
   at least one first printed circuit board and at least one second printed circuit board coupled to each other using a plurality of connectors and wherein each printed circuit board comprises, a first terminal, a second terminal, a third terminal, a diode assembly externally connected between the first terminal and the second terminal and a capacitor assembly embedded between the second terminal and the third terminal and wherein the first terminal of a first printed circuit board is connected to the third terminal of a second printed circuit board and the second terminal of the first printed circuit board is connected to the first terminal of the second printed circuit board thereby forming a part of a voltage multiplier circuit.

2. The voltage rectifier circuit of claim 1, wherein each printed circuit board further comprises plurality of dielectric mediums, each dielectric medium being separated by at least one electrically conductive plane.

3. The voltage rectifier circuit of claim 2, wherein the diode assembly comprises a plurality of diodes connected in series and the capacitor assembly comprises at least a portion of the printed circuit board.

4. The voltage rectifier circuit of claim 1, wherein the first terminal of the first printed circuit board is connected to a point maintained at a ground potential and the second terminal of the second printed circuit board is connected to a radiation source.

5. A voltage rectifier circuit for a radiation generator, the voltage rectifier circuit comprising:
   at least one first printed circuit board and at least one second printed circuit board coupled to each other using a plurality of connectors and wherein each printed circuit board comprises, a first terminal, a second terminal, a third terminal, a diode assembly externally connected between the first terminal and the second terminal and a capacitor assembly embedded between the second terminal and the third terminal and wherein the first terminal of a first printed circuit board is connected to the first terminal of a second printed circuit board and the second terminal of the first printed circuit board is connected to the second terminal of the second printed circuit board thereby forming a part of a voltage doubler circuit.

6. The voltage rectifier circuit of claim 5, wherein the second terminal of the first printed circuit board is connected to a point maintained at a ground potential and the second terminal of the second printed circuit board is connected to a radiation source.

7. A high voltage tank assembly for a radiation generator, the high voltage tank assembly comprising:
   a voltage rectifier circuit; and
   a transformer assembly coupled to the voltage rectifier circuit;
   wherein the voltage rectifier circuit is configured to include at least one first
   printed circuit board and at least one second printed circuit board coupled to each other using a plurality of connectors and wherein each printed circuit board comprises, a first terminal, a second terminal, a third terminal, a diode assembly externally connected between the first terminal and the second terminal and a capacitor assembly embedded between the second terminal and the third terminal and wherein the coupling configuration between the first printed circuit board and the second printed circuit board is set based on at least one functionality, the functionality including voltage multiplication and voltage duplication.

8. The high voltage tank assembly of claim 7, wherein the diode assembly comprises a plurality of diodes connected in series and the capacitor assembly comprises at least a portion of the printed circuit board.

9. The high voltage tank assembly of claim 7, wherein each printed circuit board further comprises plurality of dielectric mediums, each dielectric medium being separated by at least one electrically conductive plane.

10. The high voltage tank assembly of claim 7, further comprises a plurality of electrical components mounted on at least one of the first printed circuit board and the second printed circuit board, the electrical components being one of a diode, a capacitor and a high voltage resistor.

11. The high voltage tank assembly of claim 10, wherein the high voltage resistor comprises a plurality of voltage resistors connected in series.

12. The high voltage tank assembly of claim 11, wherein each voltage resistor is placed on one of the first printed circuit board and the second printed circuit board.

13. The high voltage tank assembly of claim 12, wherein each voltage resistor is connected in parallel with a capacitor assembly comprising at least a portion of the printed circuit board.

14. The high voltage tank assembly of claim 10, wherein each printed circuit board comprises a PTH and the high voltage resistor is placed in the PTH running across the first printed circuit board and the second printed circuit board.

15. The high voltage tank assembly of claim 14, wherein the high voltage resistor is connected in parallel with a configurable capacitor assembly at each printed circuit board, each configurable capacitor assembly comprising at least a portion of the printed circuit board.

16. The high voltage tank assembly of claim 7, wherein the high voltage tank assembly further comprises an insulating medium.

17. The high voltage tank assembly of claim 16, further comprises a multiplier capacitance formed by a combination of the first printed circuit board and the second printed circuit board and the insulting medium covering at least a portion in between the first printed circuit board and the second printed circuit board.

18. A high voltage tank assembly for a radiation generator, the high voltage tank assembly comprising:
- a voltage rectifier circuit configured to include at least one of a cathode multiplier and an anode multiplier;
- a transformer assembly coupled to the voltage rectifier circuit, the transformer assembly configured to include a high voltage transformer and a filament transformer;
- wherein the filament transformer comprises a core, a primary winding, a secondary winding, a bobbin configured to house the primary winding and at least one printed circuit board configured to house the secondary winding and wherein the printed circuit board is a part of the cathode multiplier.

19. The high voltage tank assembly of claim 18, wherein the output of the voltage rectifier circuit is directly coupled to the filament transformer.

* * * * *